June 11, 1963

H. K. LIGOTKY 3,093,753

PULSE CORRECTING AMPLIFIERS

Filed Sept. 21, 1959

INVENTOR.
H.K. LIGOTKY
BY [signature]
ATTORNEY

United States Patent Office 3,093,753
Patented June 11, 1963

3,093,753
PULSE CORRECTING AMPLIFIERS
Harri Kurt Ligotky, Chicago, Ill., assignor to International Telephone & Telegraph Corporation, New York, N.Y., a corporation of Maryland
Filed Sept. 21, 1959, Ser. No. 841,190
3 Claims. (Cl. 307—88.5)

This invention relates to electronic gate circuits and more particularly to pulse correcting amplifiers.

The concept of logic circuitry depends to a large extent upon pulses which are utilized to control circuit operations. In order to provide uniformity of results, it is necessary to insure uniformity of the characteristics of pulses which are transmitted through electronic circuits—this is especially true where dissimilar circuits, such as electronic and magnetic circuits, are joined. Therefore, it is common practice to provide pulse correcting amplifiers at any point in a system where previously generated pulses may be inadequate or may have deteriorated by acquiring non-uniform characteristics. These amplifiers must respond critically by providing no output responsive to signals having less than a threshold strength and by providing full-power output responsive to either A.C. or D.C. input signals which exceed a threshold strength. Moreover, pulse amplifiers must have a relatively high input impedance to avoid loading preceding circuits and must have a relatively low output impedance to insure full power to ensuing circuits. In the past, pulse amplifiers of the type described have been unduly complicated by requiring not only a number of amplifier stages but also special stages such as those which are adapted to respond to A.C. and D.C. signals, for example. Therefore, it is desirable to combine the amplifier and special stages to reduce costs and circuit complexities.

An object of this invention is to provide new and improved pulse amplifiers.

Another object of this invention is to provide pulse amplifiers which give D.C. output signals responsive to A.C. input signals.

Yet another object of this invention is to provide pulse amplifiers which respond equally to A.C. and D.C. input signals.

In accordance with this invention, at least one amplifier stage in a pulse amplifier has a capacitor connected between input and output electrodes whereby a signal derived from the output of the amplifier is fed back to maintain conductivity of the amplifier during transitions of alternating current. In this manner, a pulse amplifier provides steady state D.C. output signals for the duration of either A.C. or D.C. input signals.

The above mentioned and other objects of this invention together with the manner of obtaining them will become more apparent and the invention itself will be best understood by making reference to the following description of two embodiments of the invention taken in conjunction with the accompanying drawings in which.

Figure 1:
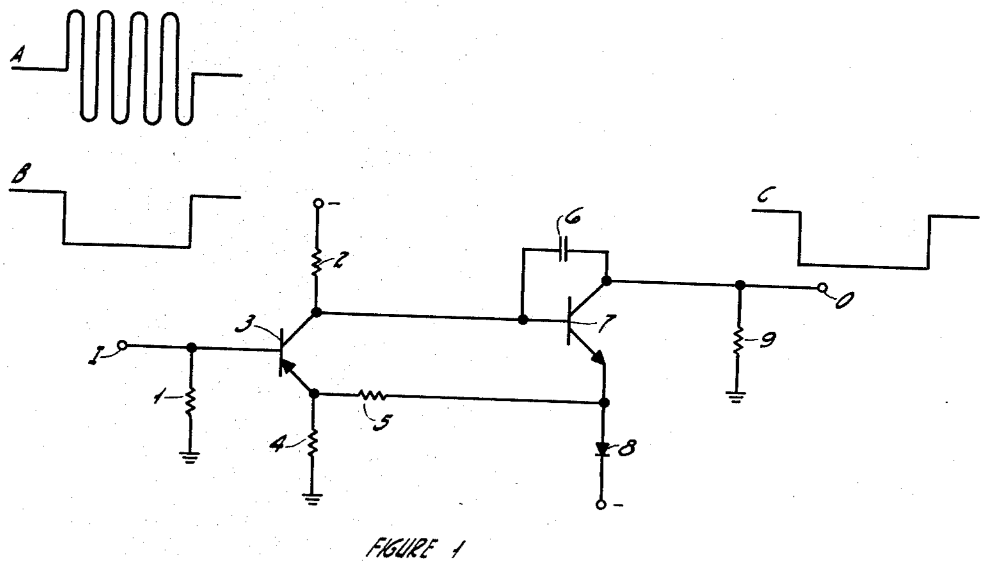
FIG. 1 shows a pulse amplifier for negative D.C. and A.C. logic.

While the electronic devices may take many forms, the embodiment which is shown in FIG. 1 includes cascaded amplifier stages comprising a pair of semi-conductors wherein P-N-P transistor 3 provides a high impedance input and N-P-N transistor 7 provides a low impedance output, thereby giving maximum output with a minimum loading on preceding circuits.

Briefly, the pulse amplifier which is shown in the drawing has two cascaded stages including transistors 3 and 7. Either an A.C. input signal A or a D.C. input signal B may be applied to terminal I whereupon transistors 3 and 7 conduct to provide an output signal C at terminal O. If the input signal is alternating current, such as that shown by curve A, capacitor 6 charges during the half-waves of the input signal which turn on transistor 3. During the half-waves of the input signal which turn off transistor 3, capacitor 6 discharges to maintain conductivity through transistor 7 and current through load resistor 9. In this manner, the pulse amplifier provides a steady state D.C. pulse at output terminal O responsive to either A.C. or D.C. input signals.

In greater detail, preceding equipment may apply signals having any suitable wave forms, such as A or B, to input terminal I. Resistance 1 provides a base current return path which allows capacity coupling to preceding equipment. Transistor 3 and the value of resistors 1 and 4 may be selected to provide a high input impedance to avoid unduly loading preceding circuits. Resistor 2 may have any suitable value which is selected with respect to the required gain and to the needs of transistor 7. The circuit extending from negative battery through diode 8, resistor 5 and resistor 4 to ground provides a voltage divider which is arranged to bias transistor 3 to turn on only responsive to input signals having a strength which exceeds a threshold value, thereby eliminating response to transients or other spurious signals. The output voltage from transistor 3 is adequate to bias transistor 7 to turn on.

Means is provided for maintaining conductivity of the pulse amplifier for the duration of an alternating current input signal. In greater detail, if the signal applied to input terminal I is an alternating current as shown by curve A, transistor 3 turns on during first half-cycles and turns off during second half-cycles; therefore, the control signal extended from transistor 3 to transistor 7 is a series of rectified half-cycles. However, transistor 7 remains in an "on" condition for the duration of the alternating current signal since a portion of the output signal from transistor 7 charges capacitor 6 during the rectified half-cycles which are produced by transistor 3. During the half-cycles which are not transmitted through transistor 3, capacitor 6 discharges to maintain conductivity through transistor 7 for the duration of the input signal despite the fluctuations thereof.

On the other hand, if a direct current signal B is applied to input terminal I, transistor 3 conducts continuously; hence, the output of transistor 7 has uniform characteristics and is the same direct current wave form C despite minor fluctuations in the input signal and without regard as to whether the input signal is A.C. or D.C.

Resistor 9 is a load having electrical values which may be selected to provide any suitable output power.

Figure 2:
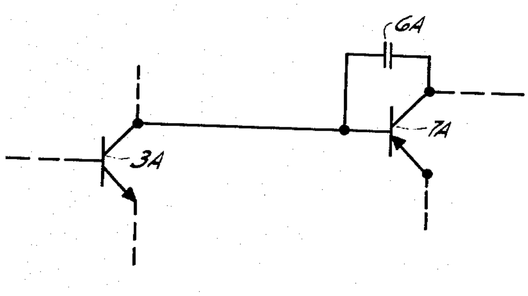
FIG. 2 shows a pulse amplifier for positive D.C. and A.C. logic.

FIG. 1 and the foregoing description provide for negative and A.C. logic. If it is necessary to provide for positive and A.C. logic, the polarities of the transistor types are reversed as shown in FIG. 2, i.e. transistor 3A becomes an N-P-N type and transistor 7A becomes a P-N-P type. Otherwise, the circuit and operation of FIG. 2 are identical to the circuit and operation of FIG. 1.

While the principles of the invention have been described above in connection with specific apparatus, it is to be clearly understood that this description is made only by way of example and not as a limitation to the scope of the invention.

I claim:

1. A pulse correcting amplifier circuit for use with logic circuitry comprising at least one input terminal and at least one output terminal, a pair of semi-conductor amplifying devices coupled between said input and output terminals, means responsive to the receipt of input signals at said input terminals for switching "on" one of said devices, said input signals having non-uniform characteristics, means responsive to said last named means for switching "on" the other of said devices to produce an output pulse, and means for feeding back said output signal to hold said other device in said "on" condition independently of the characteristics of said input signal, said feedback means consisting of a capacitor coupled directly to input and output electrodes of said other device and having a capacitance which maintains conductivity of the other of said devices for the duration of said input pulses despite the non-uniformity thereof.

2. The circuit of claim 1 wherein said semi-conductors comprise two transistors, one being a P-N-P type and the other being a N-P-N type, said capacitor being connected between the base and collector electrodes of the other of said transistors.

3. A pulse correcting amplifier gate circuit for producing output pulses having uniform characteristics for use in logic circuitry comprising a constant high impedance input circuit including a first transistor device, means responsive to the receipt of either A.C. or D.C. input signals of non-uniform characteristics for switching "on" said first transistor device, a low impedance output circuit including a second transistor device, means responsive to the output of said first transistor device for switching "on" said second transistor device to produce an output pulse, and means responsive to said output pulse for feeding back a signal to hold said second device in an "on" condition throughout the alternations of said input signal, said feedback means consisting of capacitor means coupled directly to input and output electrodes of said second device and having a capacitance which maintains the conductivity of said second device over the half cycles of said A.C. input signals.

References Cited in the file of this patent

UNITED STATES PATENTS

| | | |
|---|---|---|
| 2,831,126 | Linvill et al. | Apr. 15, 1958 |
| 2,840,727 | Guggi | June 24, 1958 |
| 2,850,694 | Hamilton | Sept. 2, 1958 |
| 2,863,123 | Koch | Dec. 2, 1958 |
| 2,890,353 | Overbeek et al. | June 9, 1959 |
| 2,905,815 | Goodrich | Sept. 22, 1959 |
| 2,980,827 | Hill | Apr. 18, 1961 |